(12) United States Patent
Su et al.

(10) Patent No.: US 11,264,411 B2
(45) Date of Patent: Mar. 1, 2022

(54) ARRAY SUBSTRATE AND DISPLAY DEVICE INCLUDING LIGHT SHIELDING LAYERS

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Tongshang Su, Beijing (CN); Dongfang Wang, Beijing (CN); Jun Liu, Beijing (CN); Qinghe Wang, Beijing (CN); Jun Wang, Beijing (CN); Ning Liu, Beijing (CN); Guangyao Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/928,562

(22) Filed: Jul. 14, 2020

(65) Prior Publication Data
US 2021/0066353 A1 Mar. 4, 2021

(30) Foreign Application Priority Data
Aug. 30, 2019 (CN) .......................... 201910817124.1

(51) Int. Cl.
*H01L 23/552* (2006.01)
*H01L 27/12* (2006.01)

(52) U.S. Cl.
CPC ........ *H01L 27/1248* (2013.01); *H01L 23/552* (2013.01); *H01L 27/1288* (2013.01)

(58) Field of Classification Search
CPC .............. H01L 27/1248; H01L 23/552; H01L 27/1288
(Continued)

(56) References Cited

U.S. PATENT DOCUMENTS

| 5,598,012 A | 1/1997 | Hebiguchi |
| 10,181,479 B2 | 1/2019 | Tan |

(Continued)

FOREIGN PATENT DOCUMENTS

| CN | 205789970 U | 12/2016 |
| CN | 106684103 A | 5/2017 |

(Continued)

OTHER PUBLICATIONS

First Chinese Office Action dated Mar. 9, 2021, received for corresponding Chinese Patent Application No. 201910817124.1; 18 pages.

*Primary Examiner* — Didarul A Mazumder
(74) *Attorney, Agent, or Firm* — Kinney & Lange, P.A.

(57) ABSTRACT

An array substrate and a display device are provided in embodiments of the present disclosure. The array substrate includes a base substrate, a buffer layer, an active layer, a gate insulating layer, a gate electrode, an interlayer insulating layer, a source-drain electrode electrically conductive layer, a passivation layer, and a first light shielding layer. The first light shielding layer is disposed on a side of the passivation layer facing away from the interlayer insulating layer. An orthographic projection of the first light shielding layer on the base substrate at least partially overlaps with an orthographic projection of the active layer on the base substrate, and the first light shielding layer is formed by a photoresist material.

15 Claims, 5 Drawing Sheets

(58) Field of Classification Search
USPC ..... 257/72; 438/48, 128, 149, 151, 157, 283
See application file for complete search history.

(56) References Cited

U.S. PATENT DOCUMENTS

2016/0370892 A1* 12/2016 Chang ................. G06F 3/04164
2018/0047764 A1*  2/2018 Deng ................ G02F 1/136209
2018/0308868 A1  10/2018 Tan

FOREIGN PATENT DOCUMENTS

| CN | 106816410 A | 6/2017 |
| CN | 107093611 A | 8/2017 |
| CN | 107731789 A | 2/2018 |
| CN | 109564916 A | 4/2019 |
| WO | 2020073308 A1 | 4/2020 |

* cited by examiner

ARRAY SUBSTRATE AND DISPLAY DEVICE INCLUDING LIGHT SHIELDING LAYERS

CROSS-REFERENCE TO RELATED APPLICATION

This application claims priority to Chinese Patent Application No. 201910817124.1 filed on Aug. 30, 2019 in the National Intellectual Property Administration of China, the whole disclosure of which is incorporated herein by reference.

TECHNICAL FIELD

Embodiments of the present disclosure relate to the field of display technology, and in particular, to an array substrate and a display device.

BACKGROUND

With the advancement of science and technology, liquid crystal displays have gradually replaced relatively large cathode ray displays in the relevant art due to their advantages such as relatively small size and relatively light weight, and they have been widely applied in electronic products such as displays, laptop computers, flat panel TVs, digital cameras, and the like.

GOA (Gate Driver on Array) technology refers to that gate drive circuit(s) may be directly fabricated on an array substrate, instead of any driver chip(s) fabricated by external silicon chip(s). An application of GOA technology may realize an integrated manufacturing of the gate drive circuit(s) and the array substrate, reduce production process procedures, reduce product process costs, and improve the integration of TFT-LCD (thin film transistor-liquid crystal display) panels.

However, in the GOA thin film transistor manufacturing technology in the relevant art, since the thin film transistors on different GOAs are biased differently and the active layers in the thin film transistors are sensitive to light, then it is likely that light illumination may easily incur a drift of the threshold voltages (Vth) of the thin film transistors. Eventually, the threshold voltages of the thin film transistors on different GOAs will be inconsistent, which in turn will easily cause uneven brightness in the display devices. In other words, the threshold voltages of the thin film transistors may be prone to drift when the thin film transistors are exposed to light illumination.

SUMMARY

The embodiments of the present disclosure have been made to overcome or alleviate at least one aspect of the above mentioned defects and/or deficiencies in the relevant art, by providing an array substrate and a display device.

Following technical solutions are provided in exemplary embodiments of the disclosure.

According to an aspect of embodiments of the disclosure, there is provided an array substrate, comprising: a base substrate;

a buffer layer on the base substrate;

an active layer, a gate insulating layer and a gate electrode stacked on the buffer layer sequentially and disposed on a side of the buffer layer facing away from the base substrate;

an interlayer insulating layer disposed on the buffer layer, the active layer, the gate insulating layer and the gate electrode, and disposed on respective sides of the buffer layer, the active layer, the gate insulating layer and the gate electrode facing way from the base substrate;

a source-drain electrode electrically conductive layer disposed on the interlayer insulating layer and located on a side of the interlayer insulating layer facing away from the buffer layer, the source-drain electrode electrically conductive layer comprising a source electrode electrically conductive region and a drain electrode electrically conductive region that are spaced apart from each other, and the source electrode electrically conductive region being electrically connected to a source electrode contact region in the active layer while the drain electrode electrically conductive region being electrically connected to a drain electrode contact region in the active layer, via conductive materials filling in through holes formed in and running through the interlayer insulating layer, respectively;

a passivation layer disposed on the interlayer insulating layer and the source-drain electrode electrically conductive layer, and located on respective sides of the interlayer insulating layer and the source-drain electrode electrically conductive layer facing away from the buffer layer;

a first light shielding layer disposed on the passivation layer and located on a side of the passivation layer facing away from the interlayer insulating layer, an orthographic projection of the first light shielding layer on the base substrate at least partially overlapping with an orthographic projection of the active layer on the base substrate, and the first light shielding layer being formed by a photoresist material According to exemplary embodiments of the present disclosure, the active layer further comprises a channel region between the source electrode contact region and the drain electrode contact region.

According to exemplary embodiments of the present disclosure, the orthographic projection of the first light shielding layer on the base substrate covers an orthographic projection of the channel region on the base substrate.

According to exemplary embodiments of the present disclosure, the orthographic projection of the first light shielding layer on the base substrate covers orthographic projections of the source electrode contact region, the drain electrode contact region and the channel region on the base substrate.

According to exemplary embodiments of the present disclosure, the photoresist material comprises one of a first color photoresist material, a second color photoresist material, or a third color photoresist material.

According to exemplary embodiments of the present disclosure, the array substrate comprises a plurality of devices, the plurality of devices comprise at least one phase inverter, and each phase inverter comprises a plurality of thin film transistors, a part of the first light shielding layer corresponding to at least one of the plurality of thin film transistors is a first color photoresist layer, and the first color photoresist layer is formed by a blue photoresist material.

According to exemplary embodiments of the present disclosure, the array substrate comprises a plurality of devices, the plurality of devices comprise at least one output tube each of which is a thin film transistor, and a part of the first light shielding layer corresponding to the thin film transistor is a second color photoresist layer, and the second color photoresist layer is formed by a red photoresist material.

According to exemplary embodiments of the present disclosure, the array substrate further comprises a second light shielding layer between the base substrate and the buffer layer, wherein an orthographic projection of the second light shielding layer on the base substrate covers the orthographic projection of the active layer on the base substrate.

According to exemplary embodiments of the present disclosure, the second light shielding layer is formed by a metal material, comprising one of molybdenum, aluminum-molybdenum alloy or molybdenum-niobium alloy.

According to another aspect of embodiments of the disclosure, there is provided a display device, comprising the array substrate as above.

According to still another aspect of embodiments of the disclosure, there is provided a method for manufacturing an array substrate, comprising:

providing a base substrate and in turn providing a buffer layer on the base substrate;

providing an active layer, a gate insulating layer and a gate electrode sequentially on a side of the buffer layer facing away from the base substrate;

providing an interlayer insulating layer on respective sides of the buffer layer, the active layer, the gate insulating layer and the gate electrode facing away from the base substrate;

providing a source-drain electrode electrically conductive layer on a side of the interlayer insulating layer facing away from the buffer layer, forming through holes in the interlayer insulating layer, and filling conductive materials in the through holes, with a source electrode electrically conductive region in the source-drain electrode electrically conductive layer being electrically connected to a source electrode contact region in the active layer, and a drain electrode electrically conductive region in the source-drain electrode electrically conductive layer being electrically connected to a drain electrode contact region in the active layer, via the conductive materials filling in through holes, respectively;

providing a passivation layer on respective sides of the interlayer insulating layer and the source-drain electrode electrically conductive layer facing away from the buffer layer; and preparing a first light shielding layer from a photoresist material on a side of the passivation layer facing away from the interlayer insulating layer, with the first light shielding layer being sized such that an orthographic projection of the first light shielding layer on the base substrate at least partially overlaps with an orthographic projection of the active layer on the base substrate.

According to exemplary embodiments of the present disclosure, the step of "preparing a first light shielding layer from a photoresist material on a side of the passivation layer facing away from the interlayer insulating layer, with the first light shielding layer being sized such that an orthographic projection of the first light shielding layer on the base substrate at least partially overlaps with an orthographic projection of the active layer on the base substrate" comprises:

providing a first light shielding layer on a side of the passivation layer facing away from the interlayer insulating layer by adopting a patterning process, with the first light shielding layer being sized such that an orthographic projection of the first light shielding layer on the base substrate covers an orthographic projection of a channel region between the source electrode contact region and the drain electrode contact region in the active layer on the base substrate.

According to exemplary embodiments of the present disclosure, the step of "preparing a first light shielding layer from a photoresist material on a side of the passivation layer facing away from the interlayer insulating layer, with the first light shielding layer being sized such that an orthographic projection of the first light shielding layer on the base substrate at least partially overlaps with an orthographic projection of the active layer on the base substrate" comprises:

providing a first light shielding layer on a side of the passivation layer facing away from the interlayer insulating layer by adopting a patterning process, with the first light shielding layer being sized such that an orthographic projection of the first light shielding layer on the base substrate covers orthographic projections of the source electrode contact region, the drain electrode contact region, and a channel region between the source electrode contact region and the drain electrode contact region in the active layer on the base substrate.

According to exemplary embodiments of the present disclosure, in a case where the array substrate to be prepared comprises a phase inverter and an output tube and each of the phase inverter and the output tube has at least one thin film transistor, the step of "providing a first light shielding layer on a side of the passivation layer facing away from the interlayer insulating layer by adopting a patterning process" comprises:

providing a first color initial photoresist layer on a side of the passivation layer facing away from the interlayer insulating layer to cover the passivation layer;

obtaining a first color photoresist layer which functions as a first light shielding layer at the respective thin film transistor in the phase inverter in the array substrate, by reserving a part of the first color initial photoresist layer while removing the other part thereof by a patterning process;

providing a second color initial photoresist layer to cover the first color photoresist layer and the passivation layer;

obtaining a second color photoresist layer which functions as a second light shielding layer at the respective thin film transistor in the output tube in the array substrate, by reserving a part of the second color initial photoresist layer while removing the other part thereof by another patterning process.

According to exemplary embodiments of the present disclosure, before the step of "providing a base substrate and in turn providing a buffer layer on the base substrate", the method further comprises: preparing a second light shielding layer on the base substrate by a patterning process, the second light shielding layer being sized such that an orthographic projection of a designed active layer which is to be prepared on the base substrate is expected to fall within a range of an orthographic projection of the second light shielding layer on the base substrate.

According to exemplary embodiments of the present disclosure, the step of "providing a base substrate and in turn providing a buffer layer on the base substrate" comprises: depositing a buffer layer on the base substrate which is already provided with the second light shielding layer.

The above description is only an overview of the technical solutions of the embodiments of the present disclosure. In order to understand the technical means of the embodiments of the present disclosure more clearly, it can be implemented in accordance with the contents of the specification, and in order to make the above and other objects, features and advantages of the embodiments of the present disclosure easier to understand, some specific implementations of the embodiments of the present disclosure will be listed below.

BRIEF DESCRIPTION OF THE DRAWINGS

Various other advantages and benefits of the present disclosure will become clear to those skilled in the art by the detailed description of the exemplary embodiments below. The drawings are merely intended for the purpose of illustrating the exemplary embodiments, rather than being considered as limiting the embodiments of the present disclosure. Furthermore, same reference numerals are used to denote the same parts throughout the drawings. In the drawings.

DETAILED DESCRIPTION OF EMBODIMENTS

Figure 1A:
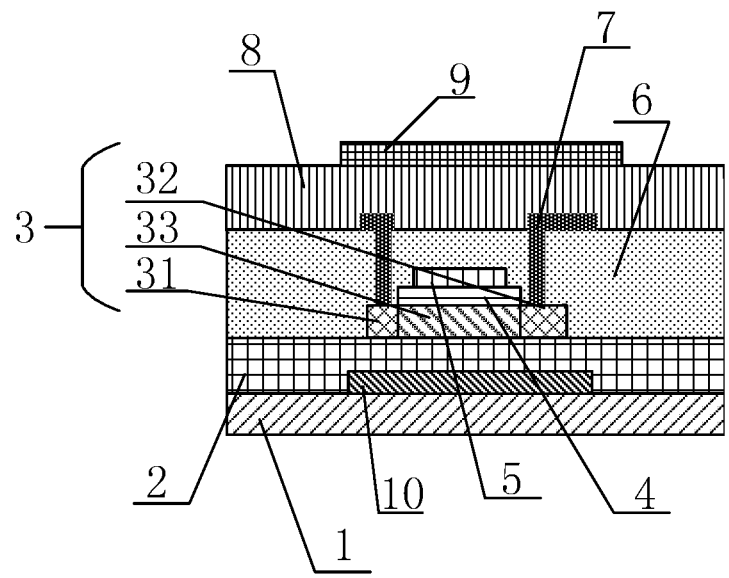
FIG. 1(a) is a schematic structural view of an array substrate according to embodiments of the present disclosure.

In order to make the objectives, technical solutions, and advantages of the embodiments of the present disclosure more clear, technical solutions of the embodiments of the present disclosure will be described clearly and completely with reference to the drawings for the embodiments of the present disclosure. Obviously, the described embodiments merely refer to a part of embodiments of the present disclosure, rather than all of the present disclosure. All other embodiments which may be obtained by those skilled in the art based on the described embodiments of the present disclosure without creative efforts essentially fall within the scope of the present disclosure.

The embodiments of the present disclosure will be described in detail below. Examples of the embodiments are shown in the drawings, throughout which same or similar reference numeral(s) may indicate same or similar element(s) or the element(s) having same or similar function. The embodiments described below with reference to the drawings are exemplary, and are merely intended to be used to interpret the embodiments of the present disclosure, but should not be construed as limiting the present disclosure. For purpose of clarity, various parts in the drawings are not drawn to scale. In addition, some well-known parts may not be shown in the drawings.

In the following, many specific details (for example, structures, materials, dimensions, treatment processes and technologies of the components) in the embodiments of the present disclosure are described, so as to assist in understanding the embodiments of the present disclosure more clearly. However, as can be understood by those skilled in the art, the embodiments of the present disclosure may not be implemented according to these specific details.

Respective dimensions and shapes of various components in the drawings are merely intended to exemplarily illustrate the embodiments of the present disclosure, rather than demonstrating true scales/proportions of the components of the array substrate and the display device according to the embodiments of the present disclosure.

Hereinafter, exemplary embodiments of the present disclosure will be described in more detail with reference to the accompanying drawings. Although the exemplary embodiments of the present disclosure have been shown in the drawings, it should be understood that the present disclosure may be implemented in various forms but should not be limited by the embodiments set forth herein. Rather, the provision of these embodiments is intended to allow a more thorough understanding of the present disclosure and to fully convey the scope of the present disclosure to those skilled in the art.

It should be understood by those skilled in the art that, unless particularly stated, the term "a", "an", "said" and "the" in singular forms used herein may also comprise plural elements. It should be further understood that the word "comprise" or "comprise" used in the description of the embodiments of the present disclosure refers to the presence of the described features, integers, steps, operations, elements and/or components, but does not exclude the presence or addition of one or more other features, integers, steps, operations, elements, components, and/or groups thereof. It should be understood that the phrase "and/or" used herein comprises all units of, any one unit of, or all combinations of one or more associated listed items.

It should be understood by those skilled in the art that, unless otherwise defined, all terms (comprising technical and scientific terms) used herein have the same meanings as those generally understood by those skilled in the art to which embodiments of the present disclosure belong. It should also be understood that the terms such as those defined in a general dictionary should be understood to have meanings consistent with the meanings in the context in the relevant art, and unless specifically defined as here, they would not be explained by an idealized or overly formal manner.

Since the thin film transistor in the relevant art is not provided with any light shielding layer, light ray(s) may be directly irradiated onto for example a channel region in an active layer of thin film transistor in the relevant art, resulting in an increase in the photo-generated carriers in the active layer (for example, the channel region) of the thin film transistor in the relevant art and an increase in the carrier concentration, which causes a negative drift of the threshold voltage of the thin film transistor in the relevant art. Moreover, the different thin film transistors in the relevant art are irradiated inconsistently, thereby it will also cause the inconsistency in the threshold voltage drift of different thin film transistors in the relevant art, which may easily cause the problem of uneven brightness in the display device.

In order to solve the above technical problems, according to the overall technical concept of the present disclosure, in a first aspect of the embodiments of the present disclosure, an array substrate is provided in the embodiments of the present disclosure disclose, as illustrated in FIG. 1(a). The array substrate comprises: a base substrate 1, a buffer layer 2, an active layer 3, a gate insulating layer 4, a gate electrode 5, an interlayer insulating layer 6, a source-drain electrode electrically conductive layer 7, a passivation layer 8, and a first light shielding layer 9.

The buffer layer 2 is provided on the base substrate 1.

The active layer 3, the gate insulating layer 4 and the gate electrode 5 are sequentially stacked and disposed on the buffer layer 2, and are specifically disposed on a side of the buffer layer 2 facing away from the base substrate 1. More specifically, the active layer 3 is provided on a surface of the buffer layer 2 facing away from the base substrate 1, and an orthographic projection of the active layer 3 on the base substrate 1 falls within, and merely partially covers an orthographic projection of the buffer layer 2 on the base substrate 1. The gate insulating layer 4 is provided on a surface of the active layer 3 facing away from the base substrate 1, and an orthographic projection of the gate insulating layer 4 on the base substrate 1 falls within, and merely partially covers the orthographic projection of the active layer 3 on the base substrate 1. The gate electrode 5 is provided on a surface of the gate insulating layer 4 facing away from the base substrate 1, and an orthographic projection of the gate electrode 5 on the base substrate 1 falls within, and merely partially covers the orthographic projection of the gate insulating layer 4 on the base substrate 1.

The interlayer insulating layer 6 is disposed on the buffer layer 2, the active layer 3, the gate insulating layer 4 and the gate electrode 5, and specifically disposed on respective sides of the buffer layer 2, the active layer 3, the gate insulating layer 4 and the gate electrode 5 facing away from the base substrate 1. More specifically, the interlayer insulating layer 6 is formed in such a way that it covers a portion of the surface of the buffer layer 2 facing away from the base substrate 1 that is not covered by the active layer 3, a portion of the surface of the active layer 3 facing away from the base substrate 1 that is not covered by the gate insulating layer 4, a portion of the surface of the gate insulating layer 4 facing away from the base substrate 1 that is not covered by the gate electrode 5, and the entire surface of the gate electrode 5 facing away from the base substrate 1, in a direct contact way (i.e., by abutting directly against the latter ones).

The source-drain electrode electrically conductive layer 7 is disposed on the interlayer insulating layer 6. Specifically, the source-drain electrode electrically conductive layer 7 is located on a surface of the interlayer insulating layer 6 facing away from the buffer layer 2, and the source-drain electrode electrically conductive layer 7 comprises: a source electrode electrically conductive region and a drain electrode electrically conductive region which are spaced apart from each other, and the source electrode electrically conductive region and the drain electrode electrically conductive region are respectively electrically connected to the active layer 3 via conductive material(s) filling in through holes formed in and running through the interlayer insulating layer 6. More specifically, in the interlayer insulating layer 6, there is formed with through holes extending from a surface of the interlayer insulating layer 6 facing away from the base substrate 1 to an opposite surface of the interlayer insulating layer 6 (said opposite surface is in contact with the surface of the active layer 3 facing away from the base substrate 1). As such, the source electrode electrically conductive region and the drain electrode electrically conductive region are electrically connected to the active layer 3 via the conductive materials filling in the through holes extending through the interlayer insulating layer and presented in the form of conductive lead-wires.

The passivation layer 8 is disposed on the interlayer insulating layer 6 and the source-drain electrode electrically conductive layer 7, and is located on respective sides of the interlayer insulating layer 6 and the source-drain electrode electrically conductive layer 7 facing away from the buffer layer 2.

The first light shielding layer 9 is disposed on the passivation layer 8 and located on a side of the passivation layer 8 facing away from the interlayer insulating layer 6. The orthographic projection of the first light shielding layer 9 on the base substrate 1 at least partially overlaps with the orthographic projection of the active layer 3 on the base substrate 1 (for example, as shown in FIG. 1(a), the orthographic projection of the first light shielding layer 9 on the base substrate 1 completely covers the orthographic projection of the active layer 3 on the base substrate 1), the first light shielding layer 9 is formed by a photoresist material.

The first light shielding layer 9 in the embodiments of the present disclosure is formed by a photoresist material and disposed on the side of the passivation layer 8 facing away from the interlayer insulating layer 6, and the orthographic projection of the first light shielding layer 9 on the base substrate 1 at least partially overlaps with the orthographic projection of the active layer 3 on the base substrate 1, therefore the first light shielding layer 9 blocks light rays from directly irradiating the active layer 3 (comprising the channel region), and does not cause an increase in carrier concentration within the channel region, thereby suppressing/restraining or almost completely preventing an occurrence of negative drift of the threshold voltage of the thin film transistors.

According to exemplary embodiments of the present disclosure, the active layer 3 specifically comprises a source electrode contact region 31, a drain electrode contact region 32, and a channel region 33 disposed between the source electrode contact region 31 and the drain electrode contact region 32. For example, the source electrode contact region 31 and the drain electrode contact region 32 are two parts of the active layer 3 that are not covered by the gate insulating layer 4, and the channel region 33 is a part of the active layer 3 disposed between the source electrode contact region 31 and the drain electrode contact region 32 and is covered by the gate insulating layer 4.

According to exemplary embodiments of the present disclosure, the source-drain electrode electrically conductive layer 7 comprises the source electrode electrically conductive region and the drain electrode electrically conductive region spaced apart from each other, the source electrode electrically conductive region is electrically connected to the source electrode contact region 31 in the active layer 3 via the conductive material filling in first through hole(s) extending through the interlayer insulating layer and presented in the form of conductive lead-wire, and the drain electrode electrically conductive region is electrically connected to the drain electrode contact region 32 in the active layer 3 via the conductive material filling in second through hole(s) extending through the interlayer insulating layer and presented in the form of conductive lead-wire.

More specifically, in the interlayer insulating layer 6, there is formed with through holes extending from the surface of the interlayer insulating layer 6 facing away from the base substrate 1 to the opposite surface of the interlayer insulating layer 6 which opposite surface is in contact with the surface of the active layer 3 facing away from the base substrate 1 (More specifically, as illustrated, the through holes comprise: the first through hole(s) extending from the surface of the interlayer insulating layer 6 facing away from the base substrate 1 to a surface of the source electrode contact region 31 in the active layer 3 facing away from the base substrate 1; and the second through hole(s) extending from the surface of the interlayer insulating layer 6 facing away from the base substrate 1 to a surface of the drain electrode contact region 32 in the active layer 3 facing away from the base substrate 1). Correspondingly, the first through hole(s) and the second through hole(s) are respectively filled with conductive material, that is, the filled conductive materials are in the form of conductive lead-wires penetrating the interlayer insulating layer 6. As such, the source electrode electrically conductive region is electrically connected to the source electrode contact region 31 in the active layer 3 via the conductive material filling in the first through hole(s) extending through the interlayer insulating layer and presented in the form of conductive lead-wire, and the drain electrode electrically conductive region is electrically connected to the drain electrode contact region 32 in the active layer 3 via the conductive material filling in the second through hole(s) extending through the interlayer insulating layer and presented in the form of conductive lead-wire.

According to an exemplary embodiment of the present disclosure, in order to enable the first light shielding layer 9 to block the channel region 33, the first light shielding layer 9 is sized such that the orthographic projection of the first light shielding layer 9 on the base substrate 1 covers an orthographic projection of the channel region 33 on the base substrate 1, so as to prevent the light rays from irradiating the channel region 33 in a first direction (the first direction is a direction pointing from the passivation layer 8 to the interlayer insulating layer 6, to the gate electrode 5 or the gate insulating layer 4, and in turn to the active layer 3, for example, a normal downward direction of the base substrate as illustrated).

According to an exemplary embodiment of the present disclosure, the first light shielding layer 9 is sized such that the orthographic projection of the first light shielding layer 9 on the base substrate 1 covers respective orthographic projections of the source electrode contact region 31, the drain electrode contact region 32, and the channel region 33 on the base substrate 1, so as to prevent light rays from irradiating the source electrode contact region 31, the drain electrode contact region 32, and the channel region 33 in the first direction.

According to an exemplary embodiment of the present disclosure, the photoresist material comprises: one of a first color photoresist material, a second color photoresist material, or a third color photoresist material, and the photoresist materials of different colors are designed for different light wavelengths. In one embodiment, the first color photoresist material is for example a blue photoresist material, the second color photoresist material is for example a red photoresist material, and the third color photoresist material is for example a green photoresist material.

Since light transmitting through photoresist materials of different colors may be different in wavelength thereof, then carriers in the active layer 3 of the thin film transistor which are excited by light may increase as the wavelength decreases. Taking advantage of this characteristic, the first light shielding layer 9 according to the embodiments of the present disclosure is for example formed by photoresist materials of different colors, for different operational environments of thin film transistor. When the thin film transistor is affected to generate a relative large negative drift of the threshold voltage thereof, the first light shielding layer may be for example formed by the red photoresist material to minimize the negative drift of the threshold voltage, due to relatively longer wavelength of red light. It is flexible to adopt photoresist materials of different colors, as per practical requirements, so as to further enhance market competitiveness.

According to an exemplary embodiment of the present disclosure, the array substrate comprises a variety of devices, for example, comprising an phase inverter, an output tube, a NAND gate, a NOR gate, a transmission gate, and a flip-flop (i.e., trigger), etc. Each device contains at least one thin film transistor.

Figure 1B:
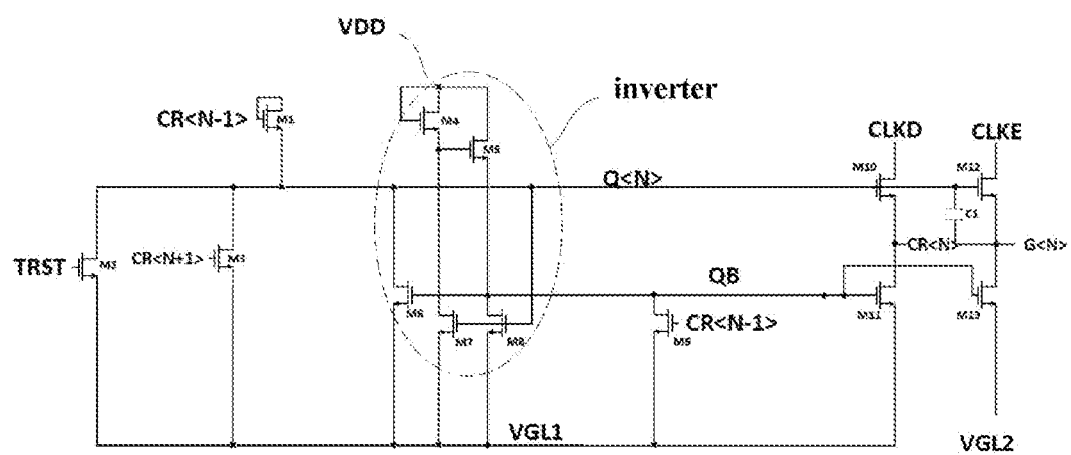
FIG. 1(b) shows an application of an exemplary implementation of the array substrate as described in FIG. 1(a) according to embodiments of the present disclosure, where a GOA drive circuit formed on the array substrate comprises, for example, phase inverter(s) and output tube(s), and each of the phase inverter(s) and the output tube(s) may have at least one thin film transistor.

FIG. 1(b) shows an application of an exemplary implementation of the array substrate as described in FIG. 1(a) according to embodiments of the present disclosure, where the array substrate comprises a phase inverter and an output tube, and the phase inverter and the output tube each has at least one thin film transistor.

As an example, as shown in FIG. 1(b), in the array substrate as illustrated, there is formed with a phase inverter which comprises, for example, a plurality of thin film transistors arranged in cascade (i.e., in a cascade arrangement), for example, five thin film transistors $M_4$ to $M_8$ as illustrated, and the phase inverter is arranged downstream of a thin film transistor $M_1$ which functions as an input tube, for example. The number of the thin film transistors in the phase inverter shown in the figure may be other values, for example, two thin film transistors, as long as they are arranged to operate cooperatively so as to realize the function of the phase inverter.

According to an exemplary embodiment of the present disclosure, the phase inverter comprises a plurality of thin film transistors. For the thin film transistor in the phase inverter, the first light shielding layer 9 is provided at the thin film transistor, for example, the first light shielding layer 9 is a first color photoresist layer. Since the threshold voltage of the thin film transistor in the phase inverter will have a serious positive drift when the thin film transistor is subject to positive bias and light irradiation for a relatively long time period, and also due to the fact that the first color photoresist layer functions as the first light shielding layer 9 provided at a respective thin film transistor (in other words, an orthographic projection of the first color photoresist layer on the base substrate for example covers an orthographic projection of the channel region of the respective thin film transistor on the base substrate; or the orthographic projection of the first color photoresist layer on the base substrate for example covers the orthographic projections of the source electrode contact region, the drain electrode contact region, and the channel region of the respective thin film transistor on the base substrate), therefore, a blue photoresist material is selected to be the material of the first color photoresist layer, that is, the characteristic that the wavelength of blue light is relatively shorter is utilized to reduce the positive drift of the threshold voltage of the thin film transistor and to weaken the influence of the positive drift on the thin film transistor.

Of course, for example, it is also possible that the first light shielding layer 9 is not provided on a portion of the passivation layer 8 at the thin film transistor in the phase inverter, facilitating saving the processes of preparing the first light shielding layer 9 there, thereby improving efficiency and reducing costs.

As an example, as shown in FIG. 1(b), in the array substrate as illustrated, there is further formed with an output tube, for example, the output tube may comprise a thin film transistor $M_{12}$.

In an exemplary embodiment, for example, as shown in FIG. 1(b), the thin film transistor M1 which functions as an input tube is used for input control of the Q<N> point; and then, by controlling to raise or lower specific levels of the clock signals CLKD and CLKE, whether the phase inverter operates may be controlled (specifically, the operations of various thin film transistors, for example $M_4$ to $M_8$, which are contained therein may be controlled), and in turn the output of the thin film transistor $M_{12}$ which functions as the output tube may also be controlled.

According to an exemplary embodiment of the present disclosure, for the thin film transistor functioning as one output tube, the first light shielding layer 9 should be provided at the thin film transistor, correspondingly, for example, so as to function as a second color photoresist layer. Since the threshold voltage of the thin film transistor in the output tube will have a serious negative drift when the thin film transistor has been switched between positive and negative bias for a relatively long time period and is influenced by light irradiation, and also due to the fact that the second color photoresist layer functions as the first light shielding layer 9 provided at a respective thin film transistor (in other words, an orthographic projection of the second color photoresist layer on the base substrate for example covers an orthographic projection of the channel region of the respective thin film transistor on the base substrate; or the orthographic projection of the second color photoresist layer on the base substrate for example covers the orthographic projections of the source electrode contact region, the drain electrode contact region, and the channel region of the respective thin film transistor on the base substrate), therefore, a red photoresist material is selected to be the material of the second color photoresist layer, that is, the characteristic that the wavelength of red light is relatively longer is utilized to reduce the negative drift of the threshold voltage of the thin film transistor and to weaken the influence of the negative drift on the thin film transistor.

According to an exemplary embodiment of the present disclosure, the array substrate further comprises, for example, a second light shielding layer 10 disposed between the base substrate 1 and the buffer layer 2, and is sized such that an orthographic projection of the second light shielding layer 10 on the base substrate 1 covers the orthographic projection of the active layer 3 on the base substrate 1. The arrangement of the second light shielding layer between the base substrate 1 and the buffer layer 2 can prevent the channel region 33 from being affected by the light irradiation in a second direction (the second direction is a direction in which the base substrate 1 or the buffer layer 2 points to the active layer 3, for example, a normal upward direction of the base substrate shown in the figure).

According to an exemplary embodiment of the present disclosure, the second light shielding layer 10 is formed by, for example, a metal material comprising one of molybdenum, aluminum-molybdenum alloy, or molybdenum-niobium alloy.

In a second aspect, according to an embodiment of the present disclosure, there is disclosed a display device comprising the array substrate according to the first aspect. Since the display device according to the second aspect comprises the array substrate according to the first aspect, then the display device has the same beneficial technical effects as the array substrate. Therefore, the beneficial effects of the display device according to the second aspect will not be repeated here.

Figure 2:
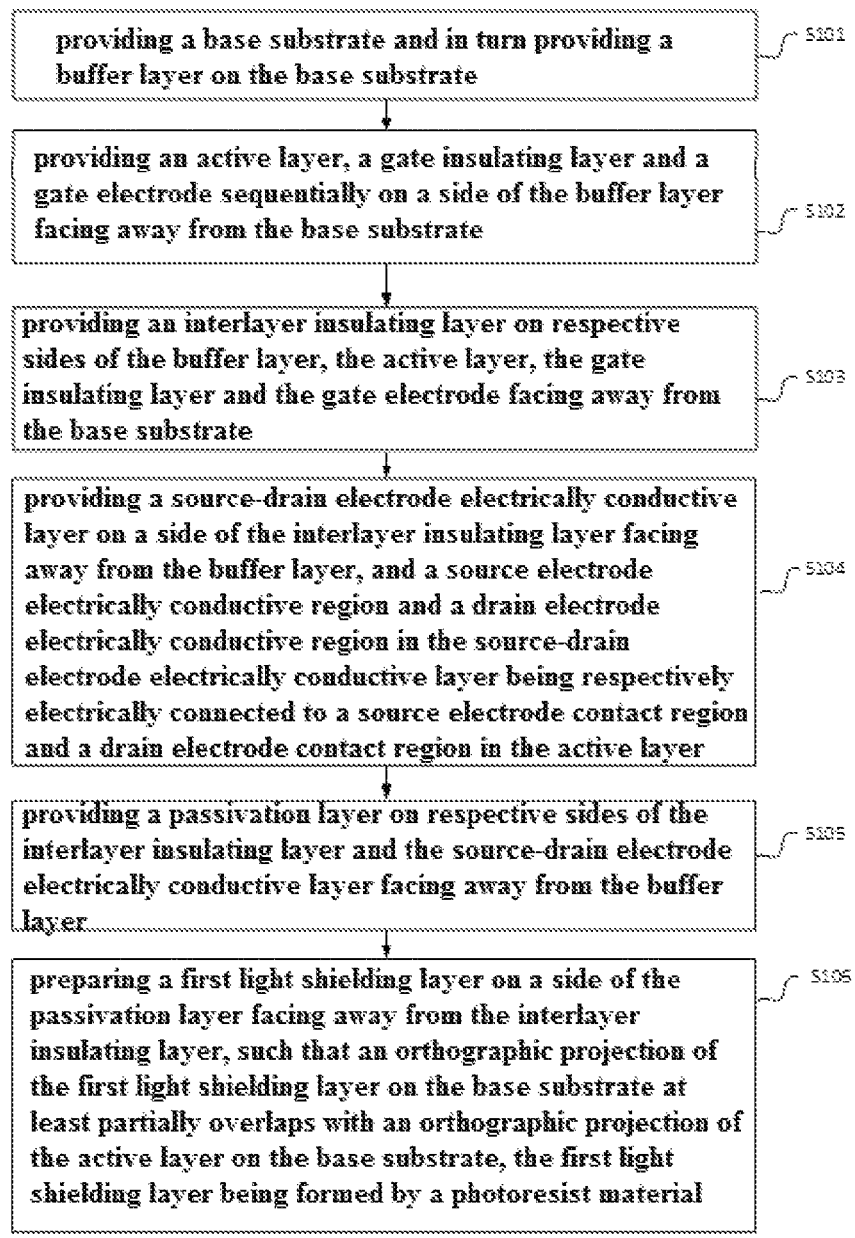
FIG. 2 is a flow chart of manufacturing an array substrate according to embodiments of the present disclosure.

In a third aspect, FIG. 2 shows a method for manufacturing an array substrate according to an embodiment of the present disclosure. The method comprises:

S101: providing a base substrate and in turn providing a buffer layer on the base substrate.

S102: providing an active layer, a gate insulating layer and a gate electrode sequentially on a side of the buffer layer facing away from the base substrate.

S103: providing an interlayer insulating layer on respective sides of the buffer layer, the active layer, the gate insulating layer and the gate electrode facing away from the base substrate.

S104: providing a source-drain electrode electrically conductive layer on a side of the interlayer insulating layer facing away from the buffer layer, forming through holes in the interlayer insulating layer, and filling conductive materials in the through holes, with a source electrode electrically conductive region in the source-drain electrode electrically conductive layer being electrically connected to a source electrode contact region in the active layer, and a drain electrode electrically conductive region in the source-drain electrode electrically conductive layer being electrically connected to a drain electrode contact region in the active layer, via the conductive materials filling in through holes, respectively.

S105: providing a passivation layer on respective sides of the interlayer insulating layer and the source-drain electrode electrically conductive layer facing away from the buffer layer.

S106: preparing a first light shielding layer from a photoresist material on a side of the passivation layer facing away from the interlayer insulating layer, with the first light shielding layer being sized such that an orthographic projection of the first light shielding layer on the base substrate at least partially overlaps with an orthographic projection of the active layer on the base substrate, the first light shielding layer being formed by a material which is selected to be a photoresist material.

Since the first light shielding layer is provided on the side of the passivation layer facing away from the interlayer insulating layer in the embodiments of the present disclosure, and the orthographic projection of the first light shielding layer on the base substrate at least partially overlaps with the orthographic projection of the active layer on the base substrate, then, the first light shielding layer blocks light from directly irradiating the active layer (for example, the channel region), thus failing to cause any increase in carrier concentration within the channel region, and preventing the negative drift of the threshold voltage.

According to an exemplary embodiment of the present disclosure, in the above step S106, the step of "preparing a first light shielding layer from a photoresist material on a side of the passivation layer facing away from the interlayer insulating layer, with the first light shielding layer being sized such that an orthographic projection of the first light shielding layer on the base substrate at least partially overlaps with an orthographic projection of the active layer on the base substrate" comprises:

providing a first light shielding layer on a side of the passivation layer facing away from the interlayer insulating layer by adopting a patterning process, with the first light shielding layer being sized such that an orthographic projection of the first light shielding layer on the base substrate covers an orthographic projection of the channel region on the base substrate.

Additionally or alternatively, according to an exemplary embodiment of the present disclosure, in the above step S106, the step of "preparing a first light shielding layer from a photoresist material on a side of the passivation layer facing away from the interlayer insulating layer, with the first light shielding layer being sized such that an orthographic projection of the first light shielding layer on the base substrate at least partially overlaps with an orthographic projection of the active layer on the base substrate" comprises:

providing a first light shielding layer on a side of the passivation layer facing away from the interlayer insulating layer by adopting a patterning process, with the first light shielding layer being sized such that an orthographic projection of the first light shielding layer on the base substrate covers orthographic projections of the source electrode contact region, the drain electrode contact region, and the channel region on the base substrate.

According to an exemplary embodiment of the present disclosure, in a case where the array substrate to be prepared comprises a phase inverter and an output tube and each of the phase inverter and the output tube has at least one thin film transistor, the step of "providing a first light shielding layer on a side of the passivation layer facing away from the interlayer insulating layer by adopting a patterning process" comprises:

providing a first color initial photoresist layer on a side of the passivation layer facing away from the interlayer insulating layer to cover the passivation layer; obtaining a first color photoresist layer which functions as a first light shielding layer at the respective thin film transistor in the phase inverter in the array substrate, by reserving a part of the first color initial photoresist layer while removing the other part thereof by a patterning process; and providing a second color initial photoresist layer to cover the first color photoresist layer and the passivation layer; obtaining a second color photoresist layer which functions as a second light shielding layer at the respective thin film transistor in the output tube in the array substrate, by reserving a part of the second color initial photoresist layer while removing the other part thereof by another patterning process.

According to an exemplary embodiment of the present disclosure, before the step of "providing a base substrate and in turn providing a buffer layer on the base substrate" in the above step S101, the method further comprises:

preparing a second light shielding layer on the base substrate by a patterning process, the second light shielding layer being sized such that an orthographic projection of a designed active layer which is to be prepared on the base substrate is expected to fall within a range of an orthographic projection of the second light shielding layer on the base substrate.

As such, according to an exemplary embodiment of the present disclosure, the step of "providing a base substrate and in turn providing a buffer layer on the base substrate" comprises:

depositing a buffer layer on the base substrate which is already provided with the second light shielding layer.

In a case where the array substrate to be prepared comprises a phase inverter and an output tube and each of the phase inverter and the output tube has at least one thin film transistor, by way of example, the output tube as illustrated in above FIG. 1(b) comprises merely one thin film transistor (e.g., TFT marked as Mu), and the phase inverter comprises at least one thin film transistor (more specifically, merely one thin film transistor marked as $M_5$ as illustrated in FIG. 1(b) which is located adjacent to TFT Mu in practice). Then, based on schematic structural views of respective products obtained by various intermediate steps of the manufacturing process shown in FIGS. 3-10, the manufacturing process of manufacturing the array substrate are set forth in detail hereinafter.

Figure 3:
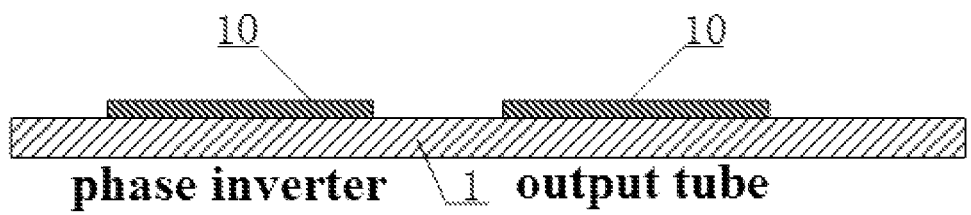
FIG. 3 is a schematic structural view of manufacturing a second light shielding layer on a base substrate, taking an array substrate which comprises a thin film transistor in a phase inverter and a thin film transistor functioning as an output tube as an example.

As shown in FIG. 3, a base substrate 1 is provided, and a second light shielding layer 10 is in turn provided on the base substrate 1. More specifically, the second light shielding layer 10 is provided at positions, where the phase inverter and the output tube are to be prepared, on the base substrate.

Figure 4:
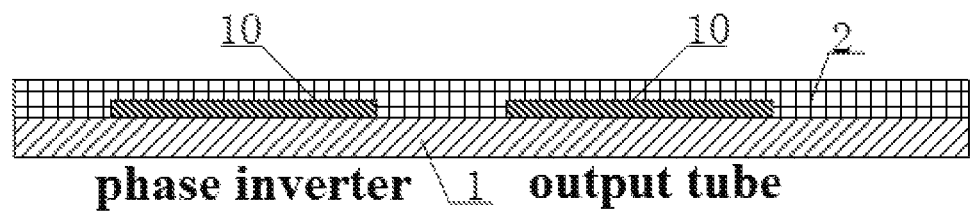
FIG. 4 is a schematic structural view of manufacturing a buffer layer on the base substrate and the second light shielding layer as illustrated in FIG. 3.

As shown in FIG. 4, a buffer layer 2 is manufactured on the second light shielding layer 10 and the base substrate 1. More specifically, the buffer layer 2 is prepared on a surface of the second light shielding layer 10 facing away from the base substrate 1 and a portion of a surface of the base substrate 1 facing away from the base substrate 1 which portion is not covered by the second light shielding layer 10.

Figure 5:
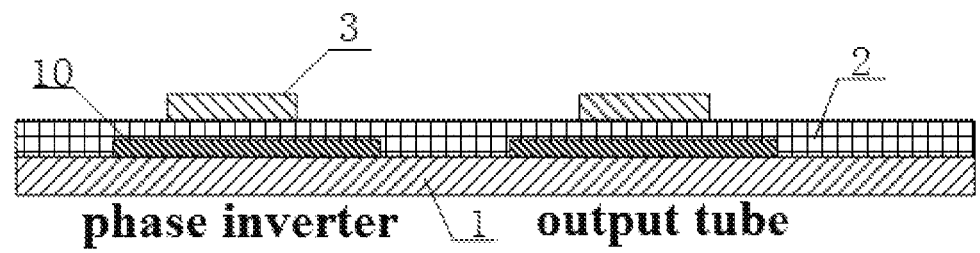
FIG. 5 is a schematic structural view of manufacturing an active layer on the buffer layer as illustrated in FIG. 4.

As shown in FIG. 5, an active layer 3 is manufactured on the buffer layer 2. Specifically, the active layer 3 is manufactured on a surface of the buffer layer 2 facing away from the base substrate 1. More specifically, the active layer 3 is manufactured on the surface of the buffer layer 2 facing away from the base substrate 1, at positions corresponding to the positions on the base substrate where the phase inverter and the output tube are to be prepared. In other words, the expression "corresponding to" here means that, for example, as shown in FIG. 5, the active layer 3 is sized such that the orthographic projection of the second light shielding layer 10 on the base substrate 1 covers an orthographic projection of the active layer 3 on the base substrate 1, thereby ensuring that the second light shielding layer 10 is expected to block light rays in the normal upward direction of the base substrate 1 from directly illuminating the active layer 3 from below.

Figure 6:
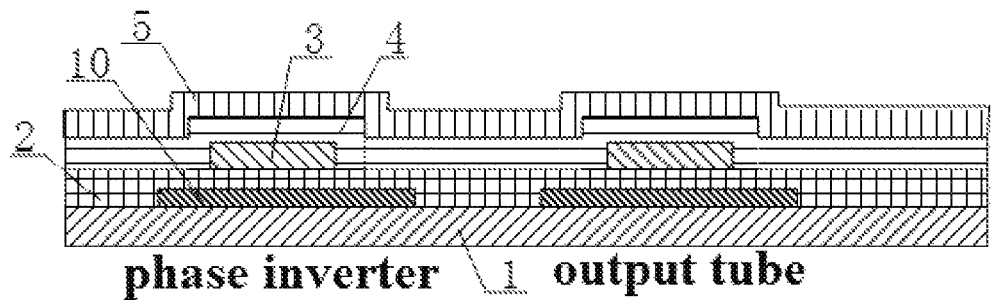
FIG. 6 is a schematic structural view of manufacturing a gate insulating layer and a gate electrode sequentially on the buffer layer and the active layer as illustrated in FIG. 5, before etching.

As shown in FIG. 6, a gate insulating layer 4 and a gate electrode 5 are sequentially coated on the buffer layer 2 and the active layer 3. Specifically, for example, each of respective orthographic projections of the gate insulating layer 4 and the gate electrode 5 on the base substrate 1 is substantially consistent with the base substrate 1 and/or the orthographic projection of the buffer layer 2 on the base substrate 1.

Figure 7:
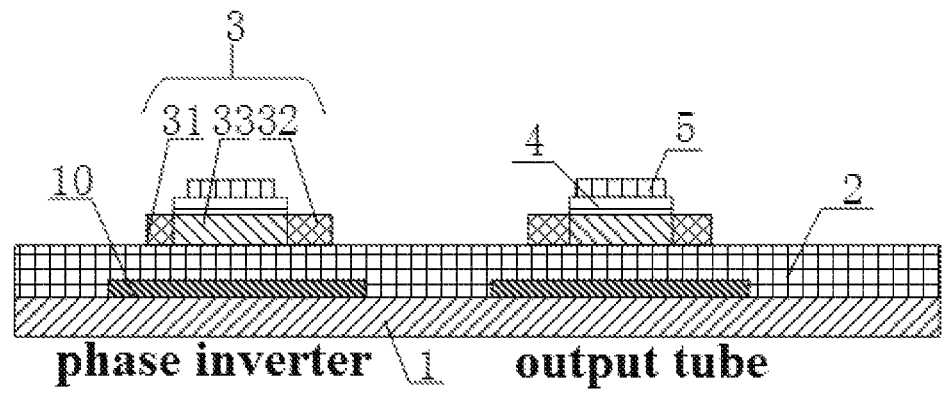
FIG. 7 is a schematic structural view of the gate insulating layer and the gate electrode as illustrated in FIG. 6, after etching.

As shown in FIG. 7, the gate electrode 5 is etched by a dry etching process, and the gate insulating layer 4 is etched by a wet etching process. Furthermore, the active layer 3 is processed by a doping process, and portions thereof which are exposed from the gate insulating layer 4 on both sides of the active layer are for example highly doped to prepare both source electrode contact region 31 and drain electrode contact region 32, while a region between the source electrode contact region 31 and the drain electrode contact region 32 is, for example, less doped to function as a channel region 33.

Figure 8:
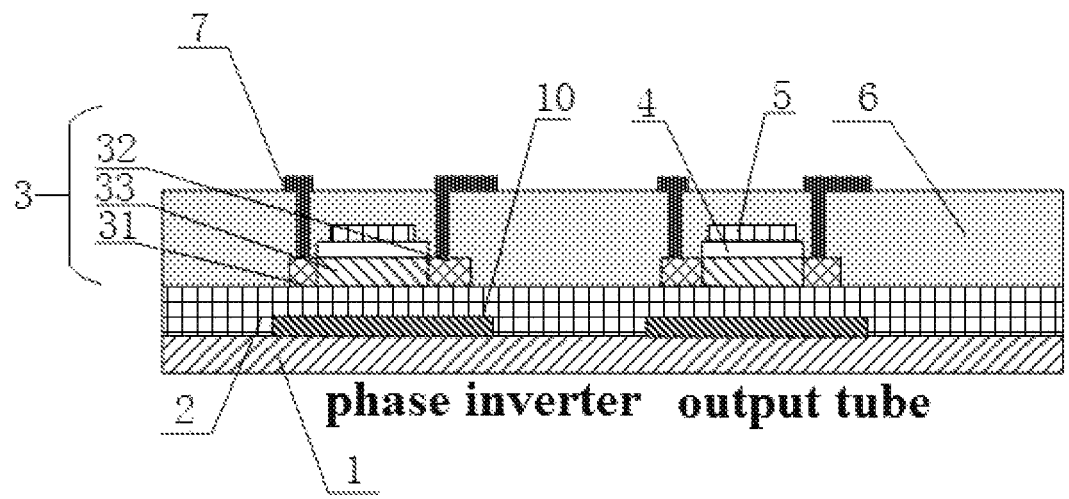
FIG. 8 is a schematic structural view of manufacturing an interlayer insulating layer on the structure as illustrated in FIG. 7 and electrically connecting a source electrode electrically conductive region to a source electrode in the active layer and electrically connecting a drain electrode electrically conductive region to a drain electrode in the active layer, respectively.

As shown in FIG. 8, an interlayer insulating layer 6 is deposited on the buffer layer 2 which is provided with the active layer 3, the gate insulating layer 4 and the gate electrode 5. Specifically, an interlayer insulating layer 6 is formed on the buffer layer 2, the active layer 3, the gate insulating layer 4 and the gate electrode 5, and more specifically on respective sides of the buffer layer 2, the active layer 3, the gate insulating layer 4 and the gate electrode 5 facing away from the base substrate, by deposition. More specifically, the interlayer insulating layer 6 is formed in such a way that it covers a portion of a surface of the buffer layer 2 facing away from the base substrate 1 that is not covered by the active layer 3, a portion of a surface of the active layer 3 facing away from the base substrate 1 that is not covered by the gate insulating layer 4, a portion of a surface of the gate insulating layer 4 facing away from the base substrate 1 that is not covered by the gate electrode 5, and an entire surface of the gate electrode 5 facing away from the base substrate 1, in a direct contact way (i.e., by directly abutting against these surfaces).

Next, a plurality of through holes penetrating through the interlayer insulating layer 6 are manufactured by a patterning process; then, each through hole is filled with a conductive material, such that the conductive material in first through hole(s) is electrically connected to the source electrode contact region 31, and the conductive material in second through hole(s) is electrically connected to the drain electrode contact region 32. Specifically, by way of example, these through holes are formed in the interlayer insulating layer 6, and extend from a surface of the interlayer insulating layer 6 facing away from the base substrate 1 to a surface of the interlayer insulating layer 6 in contact with the surface of the active layer 3 facing away from the base substrate 1. More specifically, as shown in the figure, the through holes comprises: first through hole(s) extending from the surface of the interlayer insulating layer 6 facing away from the base substrate 1 to a surface of the source electrode contact region 31 in the active layer 3 facing away from the base substrate 1; and second through hole(s) extending from the surface of the interlayer insulating layer 6 facing away from the base substrate 1 to a surface of the drain electrode contact region 32 in the active layer 3 facing away from the base substrate 1. Moreover, a source-drain electrode electrically conductive layer 7 is provided on the side of the interlayer insulating layer facing away from the buffer layer by a patterning process, and comprises a source electrode electrically conductive region and a drain electrode electrically conductive region spaced apart from each other, the source electrode electrically conductive region and the drain electrode electrically conductive region in the source-drain electrode electrically conductive layer 7 are electrically connected to the conductive materials filled in the first and second through holes, respectively. As such, the source electrode electrically conductive region is electrically connected to the source electrode contact region 31 in the active layer 3 via the conductive material filling in the first through hole(s) extending through the interlayer insulating layer and presented in the form of conductive lead-wire, and the drain electrode electrically conductive region is electrically connected to the drain electrode contact region 32 in the active layer 3 via the conductive material filling in second through hole(s) extending through the interlayer insulating layer and presented in the form of conductive lead-wire.

Figure 9:
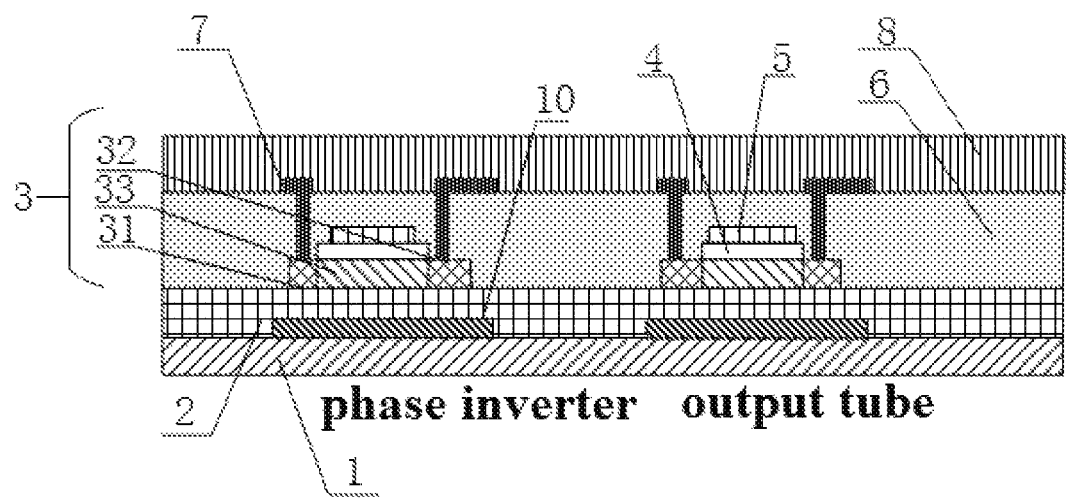
FIG. 9 is a schematic structural view of manufacturing a passivation layer on the interlayer insulating layer, the source electrode electrically conductive region and the drain electrode electrically conductive region as illustrated in FIG. 8.

As shown in FIG. 9, a passivation layer 8 is manufactured on the interlayer insulating layer 6 which is provided with the source electrode electrically conductive region and the drain electrode electrically conductive region. Specifically, the passivation layer 8 is prepared on respective sides of the interlayer insulating layer 6 and the source-drain electrode electrically conductive layer 7 facing away from the buffer layer. More specifically, the passivation layer 8 is prepared on a part of a surface of the interlayer insulating layer 6 facing away from the buffer layer which part is not covered by the source-drain electrode electrically conductive layer 7 (i.e., not covered by both the source electrode electrically conductive region and the drain electrode electrically conductive region), and on a surface of the source-drain electrode electrically conductive layer 7 facing away from the buffer layer.

Figure 10:
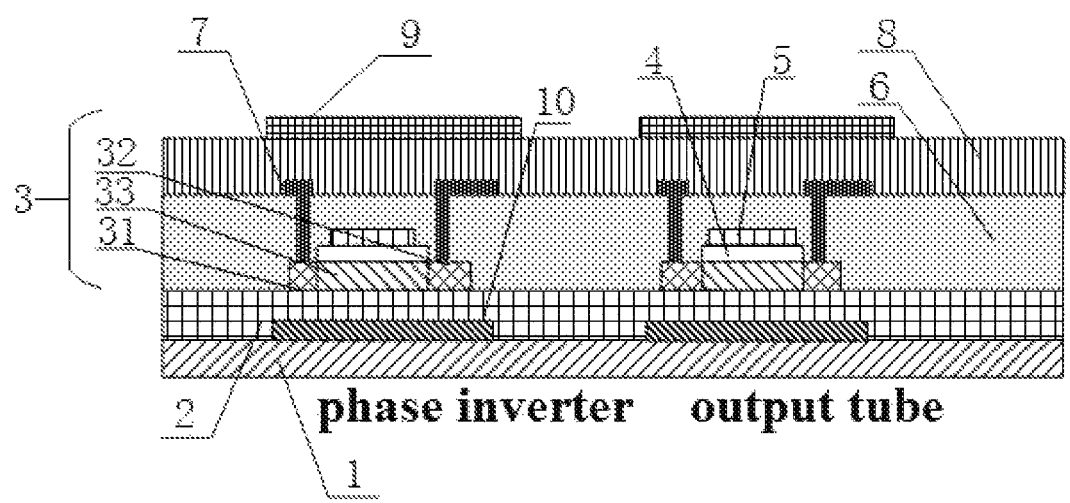
FIG. 10 is a schematic structural view of manufacturing a first light shielding layer on the passivation layer as illustrated in FIG. 9.

As shown in FIG. 10, a first light shielding layer 9 is manufactured on the passivation layer 8 as illustrated in FIG. 9. More specifically, the first light shielding layer 9 is disposed on a surface of the passivation layer 8 facing away from the interlayer insulating layer 6. Moreover, the first light shielding layer 9 used in the phase inverter is, for example, a blue photoresist layer; meanwhile, the first light shielding layer 9 used in the output tube is, for example, a red photoresist layer.

As compared with the relevant art, then, the array substrate and the display device according to the embodiments of the present disclosure based on the above technical solutions have at least the following beneficial technical effects:

Since the first light shielding layer in the embodiments of the present disclosure is formed by a photoresist material and disposed on the side of the passivation layer facing away from the interlayer insulating layer, and the orthographic projection of the first light shielding layer on the base substrate at least partially overlaps with the orthographic projection of the active layer on the base substrate (for example, the first light shielding layer is sized such that the orthographic projection of the first light shielding layer on the base substrate completely covers the orthographic projection of the active layer on the base substrate), then, the first light shielding layer blocks light from directly irradiating the active layer (comprising the channel region), facilitating suppressing the concentration of carriers excited by light in the channel region, and thereby suppressing or preventing the negative drift of the threshold voltage.

Wavelengths of the light transmitting through photoresist materials of different colors are different, and carriers excited by light increase as the wavelength decreases. Taking advantage of this characteristic, the first light shielding layer according to the embodiments of the present disclosure is for example formed by photoresist materials of different colors for different operational environments of thin film transistor. When the thin film transistors are affected to generate a relatively large negative drift of the threshold voltage, the first light shielding layer may be for example formed by a red photoresist material so as to minimize the negative drift of the threshold voltage, due to the longer wavelength of red light. As per practical requirements, it is flexible to adopt photoresist materials of different colors to further enhance the market competitiveness.

The above is merely a part of all the embodiments of the present disclosure. It should be noted that, several improvements and modifications may be made by those skilled in the art without departing from the principle of the embodiments of the present disclosure, and these improvements and modifications should fall within the scope of the present disclosure. The scope of the present disclosure is defined merely by the appended claims.

What is claimed is:

1. An array substrate, comprising:
a base substrate;
a buffer layer on the base substrate;
an active layer, a gate insulating layer and a gate electrode stacked on the buffer layer sequentially and disposed on a side of the buffer layer facing away from the base substrate;
an interlayer insulating layer disposed on the buffer layer, the active layer, the gate insulating layer and the gate electrode, and disposed on respective sides of the buffer layer, the active layer, the gate insulating layer and the gate electrode facing away from the base substrate;
a source-drain electrode electrically conductive layer disposed on the interlayer insulating layer and located on a side of the interlayer insulating layer facing away from the buffer layer, the source-drain electrode electrically conductive layer comprising a source electrode electrically conductive region and a drain electrode electrically conductive region that are spaced apart from each other, and the source electrode electrically conductive region being electrically connected to a source electrode contact region in the active layer while the drain electrode electrically conductive region being electrically connected to a drain electrode contact region in the active layer, via conductive materials filling in through holes formed in and running through the interlayer insulating layer, respectively;
a passivation layer disposed on the interlayer insulating layer and the source-drain electrode electrically conductive layer, and located on respective sides of the interlayer insulating layer and the source-drain electrode electrically conductive layer facing away from the buffer layer; and
a first light shielding layer disposed on the passivation layer and located on a side of the passivation layer facing away from the interlayer insulating layer, an orthographic projection of the first light shielding layer on the base substrate at least partially overlapping with an orthographic projection of the active layer on the base substrate, and the first light shielding layer being formed by a photoresist material,
wherein the photoresist material comprises one of a first color photoresist material, a second color photoresist material, or a third color photoresist material; and
wherein the array substrate comprises a plurality of devices, the plurality of devices comprise at least one phase inverter, each phase inverter comprises a plurality of thin film transistors, a part of the first light shielding layer corresponding to at least one of the plurality of thin film transistors is a first color photoresist layer, and the first color photoresist layer is formed by a blue photoresist material.

2. The array substrate according to claim 1, wherein the active layer further comprises a channel region between the source electrode contact region and the drain electrode contact region.

3. The array substrate according to claim 2, wherein the orthographic projection of the first light shielding layer on the base substrate covers an orthographic projection of the channel region on the base substrate.

4. The array substrate according to claim 2, wherein the orthographic projection of the first light shielding layer on the base substrate covers orthographic projections of the source electrode contact region, the drain electrode contact region and the channel region on the base substrate.

5. The array substrate according to claim 1, wherein the plurality of devices comprise at least one output tube each of which is a thin film transistor, and a part of the first light shielding layer corresponding to the thin film transistor is a second color photoresist layer, and the second color photoresist layer is formed by a red photoresist material.

6. The array substrate according to claim 1, further comprising a second light shielding layer between the base substrate and the buffer layer, wherein an orthographic projection of the second light shielding layer on the base substrate covers the orthographic projection of the active layer on the base substrate.

7. The array substrate according to claim 6, wherein the second light shielding layer is formed by a metal material, comprising one of molybdenum, aluminum-molybdenum alloy or molybdenum-niobium alloy.

8. A display device, comprising the array substrate according to claim 1.

9. A method for manufacturing an array substrate, comprising:
providing a base substrate and in turn providing a buffer layer on the base substrate;
providing an active layer, a gate insulating layer and a gate electrode sequentially on a side of the buffer layer facing away from the base substrate;
providing an interlayer insulating layer on respective sides of the buffer layer, the active layer, the gate insulating layer and the gate electrode facing away from the base substrate;
providing a source-drain electrode electrically conductive layer on a side of the interlayer insulating layer facing away from the buffer layer, forming through holes in the interlayer insulating layer, and filling conductive materials in the through holes, with a source electrode electrically conductive region in the source-drain electrode electrically conductive layer being electrically connected to a source electrode contact region in the active layer, and a drain electrode electrically conductive region in the source-drain electrode electrically conductive layer being electrically connected to a drain electrode contact region in the active layer, via the conductive materials filling in through holes, respectively;
providing a passivation layer on respective sides of the interlayer insulating layer and the source-drain electrode electrically conductive layer facing away from the buffer layer; and
preparing a first light shielding layer from a photoresist material on a side of the passivation layer facing away from the interlayer insulating layer, with the first light shielding layer being sized such that an orthographic projection of the first light shielding layer on the base substrate at least partially overlaps with an orthographic projection of the active layer on the base substrate,
wherein the array substrate being manufacture comprises a phase inverter having at least one thin film transistor,
wherein the step of providing a first light shielding layer on a side of the passivation layer facing away from the interlayer insulating layer is performed by a patterning process, and comprises:
providing a first color initial photoresist layer on the side of the passivation layer facing away from the interlayer insulating layer to cover the passivation layer; and
obtaining a first color photoresist layer which functions as a first light shielding layer at the respective thin film transistor in the phase inverter in the array substrate, by reserving a first part of the first color initial photoresist layer while removing a second part thereof by patterning, wherein the first color photoresist layer is formed by a blue photoresist material.

10. The method according to claim 9, wherein the step of preparing a first light shielding layer from a photoresist material on a side of the passivation layer facing away from the interlayer insulating layer, with the first light shielding layer being sized such that an orthographic projection of the first light shielding layer on the base substrate at least partially overlaps with an orthographic projection of the active layer on the base substrate, comprises:
providing the first light shielding layer with the first light shielding layer being sized such that an orthographic projection of the first light shielding layer on the base substrate covers an orthographic projection of a channel region between the source electrode contact region and the drain electrode contact region in the active layer on the base substrate.

11. The method according to claim 9, wherein the step of preparing a first light shielding layer from a photoresist material on a side of the passivation layer facing away from the interlayer insulating layer, with the first light shielding layer being sized such that an orthographic projection of the first light shielding layer on the base substrate at least partially overlaps with an orthographic projection of the active layer on the base substrate, comprises:
providing the first light shielding layer with the first light shielding layer being sized such that an orthographic projection of the first light shielding layer on the base substrate covers orthographic projections of the source electrode contact region, the drain electrode contact region, and a channel region between the source electrode contact region and the drain electrode contact region in the active layer on the base substrate.

12. The method according to claim 10, wherein the array substrate being manufactured comprises an output tube, having at least one thin film transistor, and wherein the step of providing a first light shielding layer on a side of the passivation layer facing away from the interlayer insulating layer by performing a patterning process comprises:
providing a second color initial photoresist layer to cover the first color photoresist layer and the passivation layer; and
obtaining a second color photoresist layer which functions as a second light shielding layer at the respective thin film transistor in the output tube in the array substrate, by reserving a part of the second color initial photoresist layer while removing the other part thereof by another patterning process.

13. The method according to claim 11, wherein the array substrate being manufactured comprises an output tube, having at least one thin film transistor, and the step of providing a first light shielding layer on a side of the passivation layer facing away from the interlayer insulating layer by performing a patterning process comprises:
providing a second color initial photoresist layer to cover the first color photoresist layer and the passivation layer; and
obtaining a second color photoresist layer which functions as a second light shielding layer at the respective thin film transistor in the output tube in the array substrate, by reserving a part of the second color initial photoresist layer while removing the other part thereof by another patterning process.

14. The method according to claim 9, wherein, before the step of providing a base substrate and in turn providing a buffer layer on the base substrate, the method further comprises:
preparing a second light shielding layer on the base substrate by a patterning process, the second light shielding layer being sized such that an orthographic projection of a designed active layer which is to be prepared on the base substrate is expected to fall within a range of an orthographic projection of the second light shielding layer on the base substrate.

15. The method according to claim 14, wherein the step of providing a base substrate and in turn providing a buffer layer on the base substrate comprises:
depositing a buffer layer on the base substrate which is already provided with the second light shielding layer.

* * * * *